(12) United States Patent
Kim

(10) Patent No.: US 8,698,238 B2
(45) Date of Patent: Apr. 15, 2014

(54) SEMICONDUCTOR DEVICES AND METHODS OF FORMING THE SAME

(71) Applicant: Samsung Electronics Co., Ltd., Gyeonggi-do (KR)

(72) Inventor: Yongdon Kim, Gyeonggi-do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/706,878

(22) Filed: Dec. 6, 2012

(65) Prior Publication Data
US 2013/0146974 A1 Jun. 13, 2013

(30) Foreign Application Priority Data
Dec. 12, 2011 (KR) .................. 10-2011-0140380

(51) Int. Cl.
*H01L 29/78* (2006.01)
(52) U.S. Cl.
USPC ........... 257/335; 257/296; 257/334; 257/336; 257/E29.256; 257/E21.41
(58) Field of Classification Search
USPC .................. 257/296–340, E29.256–E29.261
See application file for complete search history.

(56) References Cited

U.S. PATENT DOCUMENTS

| | | |
|---|---|---|
| 5,844,275 A | 12/1998 | Kitamura et al. |
| 6,878,603 B2 | 4/2005 | Bromberger et al. |
| 7,407,851 B2 | 8/2008 | Miller et al. |
| 8,012,838 B2 | 9/2011 | Kim |
| 2009/0140334 A1* | 6/2009 | Chang ........................... 257/336 |
| 2010/0006937 A1 | 1/2010 | Lee |
| 2010/0163991 A1 | 7/2010 | Kim et al. |
| 2010/0301411 A1 | 12/2010 | Takeda et al. |
| 2012/0112274 A1* | 5/2012 | Yamada ........................ 257/335 |
| 2012/0299093 A1* | 11/2012 | Kim ............................. 257/335 |
| 2013/0292764 A1* | 11/2013 | Yang et al. .................... 257/336 |

FOREIGN PATENT DOCUMENTS

| | | |
|---|---|---|
| GB | 2295052 A | 5/1996 |
| JP | 08097411 | 4/1996 |
| JP | 08213617 | 8/1996 |

(Continued)

OTHER PUBLICATIONS

S. Yanagi, et al., "0.15 um BiC-DMOS Technology with Novel Stepped-STI N-Channel LDMOS", ISPSD 2009, pp. 80-83: Renesas Tech Corp.

(Continued)

*Primary Examiner* — Mamadou Diallo
(74) *Attorney, Agent, or Firm* — F. Chau & Associates, LLC

(57) ABSTRACT

A method of forming a semiconductor device is provided. The method includes preparing a substrate having a transistor region and an alignment region, forming a first trench and a second trench in the substrate of the transistor region and in the substrate of the alignment region, respectively, forming a drift region in the substrate of the transistor region, forming two third trenches respectively adjacent to two ends of the drift region, and forming an isolation pattern in the first trench, a buried dielectric pattern in the second trench, and dielectric patterns in the two third trenches, respectively. A depth of the first trench is less than a depth of the third trenches, and the depth of the first trench is equal or substantially equal to a depth of the second trench.

12 Claims, 8 Drawing Sheets

(56) References Cited

FOREIGN PATENT DOCUMENTS

| | | |
|---|---|---|
| JP | 11354779 | 12/1999 |
| JP | 2001274394 | 10/2001 |
| JP | 2003060205 | 2/2003 |
| JP | 2010278312 | 12/2010 |
| JP | 2011029214 | 2/2011 |
| KR | 1020040057822 A | 7/2004 |
| KR | 1020050055222 A | 6/2005 |
| KR | 1020100006342 A | 1/2010 |
| KR | 102010081628 A | 7/2010 |
| KR | 1020100079548 A | 7/2010 |
| KR | 1020100135441 A | 12/2010 |

OTHER PUBLICATIONS

S. Haynie, et al. "Power LDMOS with Novel STI Profile for Improved Rsp, BVdss, and Reliability," ISPSD 2010, pp. 241-243: National Semi Corp.

* cited by examiner

SEMICONDUCTOR DEVICES AND METHODS OF FORMING THE SAME

CROSS-REFERENCE TO RELATED APPLICATIONS

This U.S. non-provisional patent application claims priority under 35 U.S.C. §119 to Korean Patent Application No. 10-2011-0140380, filed on Dec. 22, 2011, the disclosure of which is hereby incorporated by reference in its entirety.

TECHNICAL FIELD

Embodiments of the present disclosure herein relate to semiconductor devices and methods of forming the same.

DISCUSSION OF RELATED ART

In the semiconductor device, carriers, such as electrons or holes, travel through a channel between predetermined doping regions. The distance or area of travel of the carriers may affect on-resistance of the semiconductor device.

SUMMARY

Exemplary embodiments are directed to semiconductor devices and methods of forming the same.

According to an exemplary embodiment, a method of forming a semiconductor device includes preparing a substrate having a transistor region and an alignment region, forming a first trench and a second trench in the substrate of the transistor region and in the substrate of the alignment region respectively, forming a drift region in the substrate of the transistor region, forming two third trenches respectively adjacent to two ends of the drift region, and forming an isolation pattern in the first trench, a buried dielectric pattern in the second trench, and dielectric patterns in the two third trenches, respectively. A depth of the first trench is less than a depth of the third trenches, and the depth of the first trench is equal or substantially equal to a depth of the second trench.

The first and second trenches may be simultaneously formed using a single patterning process.

The second trench may be used as an alignment key in subsequent exposure processes.

Forming the drift region may include implanting dopants of a first conductivity type into the substrate surrounding the first trench in the transistor region.

The method may further include forming a first well region and a second well region in the drift region. The first well region may be formed between one of the dielectric patterns and the isolation pattern, the first well region may be formed to be spaced apart from the isolation pattern, and the second well region may be formed between the other of the dielectric patterns and the isolation pattern. The first well region may be formed by implanting dopants of a second conductivity type different from the first conductivity type, and the second well region may be formed by implanting dopants of the first conductivity type.

Forming the isolation pattern, the buried dielectric pattern and the dielectric patterns may include forming a dielectric layer in the first, second and third trenches and on the substrate, and planarizing the dielectric layer until a top surface of the substrate is exposed.

A bottom surface of the first trench may be flat such that a depth of the first trench is uniform throughout the entire bottom surface of the first trench.

According to an exemplary embodiment, a semiconductor device includes two dielectric patterns in a substrate, a drift region disposed in the substrate between the two dielectric patterns to have a protrusion protruding toward a bottom surface of the substrate, an isolation pattern in the drift region between the two dielectric patterns, a gate pattern on the substrate, and a source region and a drain region at both sides of the gate pattern. A depth of the two dielectric patterns is greater than a depth of the isolation pattern.

An entire bottom surface of the isolation pattern may have a uniform depth.

The protrusion of the drift region may overlap the isolation pattern.

The substrate may have a transistor region and an alignment region. The semiconductor device may further include a buried dielectric pattern in the substrate of the alignment region. A depth of the buried dielectric pattern may be equal or substantially equal to the depth of the isolation pattern.

The semiconductor device may further include a first well region and a second well region disposed in the drift region. The first and second well regions may be spaced apart from each other. The first well region may be disposed between one of the two dielectric patterns and the isolation pattern, and the second well region may be disposed between the other of the dielectric patterns and the isolation pattern. The first well region may be spaced apart from the isolation pattern. The semiconductor device may further include a first doping region and a second doping region in the first well region, and a third doping region in the second well region. The gate pattern may cover the first well region and the drift region disposed between the second doping region and the isolation pattern. When voltage biases are applied to the gate pattern, the first doping region, the second doping region and the third doping region, carriers may be drifted along the drift region between the first and second well regions.

According to an embodiment, there is provided a semiconductor device including a substrate, a drift region in the substrate, wherein the drift region includes a protrusion, a first doping pattern, a second doping pattern, an isolation pattern between the first and second doping patterns, wherein the isolation pattern is spaced apart from the first doping pattern and contacts the second doping pattern, and a gate pattern on the substrate, wherein the gate pattern overlaps at least a portion of the isolation pattern, wherein the protrusion of the drift region overlaps at least a portion of the isolation pattern.

The semiconductor device further includes a dielectric pattern adjacent to at least one of the first doping pattern or the second doping pattern, wherein a depth of the dielectric pattern is larger than a depth of the isolation pattern.

A width of the protrusion of the drift region is the same or substantially the same as a width of the isolation pattern or is larger than the width of the isolation pattern.

The semiconductor device further includes a well region in the substrate, wherein the well region covers the first doping pattern, and wherein at least a portion of the well region overlaps the gate pattern.

BRIEF DESCRIPTION OF THE DRAWINGS

The embodiments of the disclosure will become more apparent in view of the attached drawings and accompanying detailed description.

DETAILED DESCRIPTION OF THE EMBODIMENTS

Figure 1:
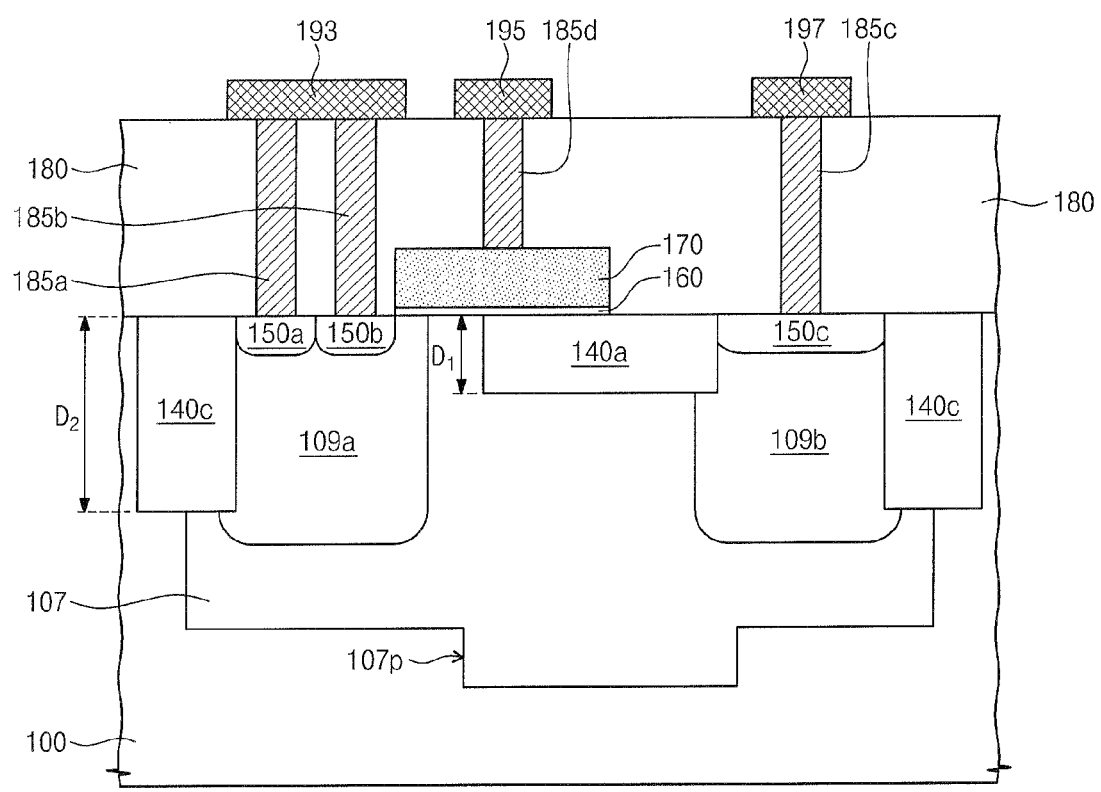
FIG. 1 is a cross sectional view illustrating a semiconductor device according to an embodiment.

Embodiments of the inventive subject matter will now be described more fully hereinafter with reference to the accompanying drawings. It should be noted, however, that the inventive subject matter is not limited to the following exemplary embodiments, and may be implemented in various forms.

As used herein, the singular terms "a," "an" and "the" are intended to include the plural forms as well, unless the context clearly indicates otherwise. It will be understood that when an element such as a layer, region or substrate is referred to as being "on" another element, it can be directly on the other element or intervening elements may be present. The same reference numerals or the same reference designators may denote the same or substantially the same elements throughout the specification and the drawings.

As used herein, the term "and/or" includes any and all combinations of one or more of the associated listed items. It will be understood that when an element is referred to as being "connected" or "coupled" to another element, it may be directly connected or coupled to the other element or intervening elements may be present.

FIG. 1 is a cross sectional view illustrating a semiconductor device according to an embodiment.

Referring to FIG. 1, two dielectric patterns 140c may be disposed in a substrate 100. The two dielectric patterns 140c may be spaced apart from each other. According to an embodiment, each of the dielectric patterns 140c may include a nitride layer, an oxide layer or an oxynitride layer. According to an embodiment, the substrate 100 may be a silicon substrate, a germanium substrate or a compound semiconductor substrate. Alternatively, the substrate 100 may include an epitaxial semiconductor layer.

A drift region 107 may be disposed in the substrate 100. The drift region 107 may be disposed between the two dielectric patterns 140c. The drift region 107 may be a portion of the substrate 100. The drift region 107 may be doped with dopants of a first conductivity type. The drift region 107 may include a body and a protrusion 107p protruding from a bottom portion of the body toward a bottom surface of the substrate 100.

An isolation pattern 140a may be disposed in the drift region 107. The isolation pattern 140a may be disposed between the two dielectric patterns 140c and may be spaced apart from the two dielectric patterns 140c. According to an embodiment, the isolation pattern 140a may include a nitride layer, an oxide layer or an oxynitride layer. According to an embodiment, the isolation pattern 140a may include the same material as the dielectric patterns 140c. For example, according to an embodiment, the isolation pattern 140a and the dielectric patterns 140c may include a silicon oxide layer.

The isolation pattern 140a may be disposed to have a first depth D1 from a top surface of the substrate 100, and the dielectric patterns 140c may be disposed to have a second depth D2 from a top surface of the substrate 100. According to an embodiment, the first depth D1 may be less than the second depth D2. For example, according to an embodiment, the second depth D2 may be at least twice the first depth D1. For example, according to an embodiment, the first depth D1 may be 0.15~0.2 µm, and the second depth D2 may be 0.4~0.6 µm.

In an embodiment, an entire bottom surface of the isolation pattern 140a may be flat. For example, a distance between the top surface and the bottom surface of the isolation pattern 140a may be uniform throughout the isolation pattern 140a. For example, a distance between the top surface and the bottom surface of the isolation pattern 140a may be kept uniform at the first depth D1. Accordingly, the bottom surface of the isolation pattern 140a may be flat without any uneven profile or any step differences.

In an embodiment, at least a portion of the isolation pattern 140a may overlap the protrusion 107p of the drift region 107. For example, according to an embodiment, the isolation pattern 140a may completely overlap the protrusion 107p of the drift region 107.

The isolation pattern 140a may have a first width in a first direction, and the protrusion 107p of the drift region 107 may have a second width in the first direction. The first direction may be a direction from one of the two dielectric patterns 140c toward the other of the two dielectric patterns 140c. According to an embodiment, the second width may be substantially equal to or greater than the first width. However, the inventive concept is not limited to the above description. For example, alternatively, the second width of the protrusion 107p may be less than the first width of the isolation pattern 140a.

According to an embodiment, the dielectric patterns 140c and the isolation pattern 140a may define active regions in the substrate 100.

A first well region 109a and a second well region 109b may be disposed in the drift region 107. In an embodiment, the second well region 109b may have the same conductivity type as the drift region 107, and the first well region 109a may have a different conductivity type from the drift region 107. For example, according to an embodiment, when the drift region 107 have the first conductivity type, the second well region 109b may have the first conductivity type, and the first well region 109a may have a second conductivity type different from the first conductivity type.

The first well region 109a and the second well region 109b may be spaced apart from each other. The first well region 109a may be disposed in the drift region 107 between one of the two dielectric patterns 140c and the isolation pattern 140a. In an embodiment, the first well region 109a may be spaced apart from the isolation pattern 140a, for example, by a portion of the drift region 107.

According to an embodiment, a dopant concentration of the drift region 107 may be less than dopant concentrations of the first well region 109a and the second well region 109b.

The second well region 109b may be disposed in the drift region 107 between the other of the two dielectric patterns 140c and the isolation pattern 140a. In an embodiment, at least a portion of the isolation pattern 140a may overlap the second well region 109b. For example, according to an embodiment, an end portion of the isolation pattern 140a may laterally extend into the second well region 109b such that a sidewall of the isolation pattern 140a is located in the second well region 109b. However, the inventive concept is not limited to the above description. For example, according to an embodiment, the isolation pattern 140a may overlap the second well region 109b. For example, the isolation pattern 140a may be disposed in the second well region 109b.

A first doping region 150a and a second doping region 150b may be disposed in the first well region 109a. The first doping region 150a and the second doping region 150b may be sequentially arrayed in a surface region of the first well region 109a along a direction from the dielectric pattern 140c adjacent to the first well region 109a toward the isolation pattern 140a. In an embodiment, the first and second doping regions 150a and 150b may be disposed to contact each other.

A conductivity type of the first doping region 150a may be different from a conductivity type of the second doping region 150b. According to an embodiment, the first doping region 150a may have the same conductivity type as the first well region 109a, and the second doping region 150b may have the same conductivity type as the drift region 107. For example, according to an embodiment, when the drift region 107 have the first conductivity type, the first doping region 150a may have the second conductivity type, and the second doping region 150b may have the first conductivity type.

A third doping region 150c may be disposed in the second well region 109b. The third doping region 150c may be disposed in a surface region of the second well region 109b and may overlap at least a portion of the second well region 109b. The third doping region 150c may have the same conductivity type as the second well region 109b and the drift region 107. For example, according to an embodiment, when the drift region 107 have the first conductivity type, the third doping region 150c may also have the first conductivity type.

According to an embodiment, a dopant concentration of the first doping region 150a may be greater than a dopant concentration of the first well region 109a, and dopant concentrations of the second and third doping regions 150b and 150c may be greater than a dopant concentration of the second well region 109b.

A gate pattern 170 may be disposed on the substrate 100. The gate pattern 170 may overlap at least a portion of the isolation pattern 140a, a portion of the drift region 107, and at least a portion of the first well region 109a. The gate pattern 170 may cover a portion of the drift region 107 between the isolation pattern 140a and the first well region 109a and a portion of the first well region 109a between the second doping region 150b and the drift region 107.

A portion of the first well region 109a, which overlaps the gate pattern 170, may correspond to a channel region. When a semiconductor device according to an embodiment operates, an inversion channel may be formed in the channel region. When the inversion channel is formed in the channel region, carriers (e.g., electrons or holes) may move from the third doping region 150c toward the second doping region 150b through the drift region 107 and the inversion channel. In an example, the first doping region 150a may have a P type conductivity, the second doping region 150b may have an N type conductivity, the third doping region 150c may have an N type conductivity. The second doping region 150b and the third doping region 150c may be a source and drain region, respectively. The semiconductor device may be an N type power MOSFET. In other example, the first doping region 150a may have an N type conductivity, the second doping region 150b may have a P type conductivity, the third doping region 150c may have an P type conductivity. The semiconductor device may be a P type power MOSFET.

The gate pattern 170 may include at least one of a doped semiconductor layer (e.g., a doped silicon layer, a doped germanium layer or the like), a metal layer (e.g., a tungsten layer, a titanium layer, a tantalum layer or the like), a conductive metal nitride layer (e.g., a titanium nitride layer, a tantalum nitride layer or the like), and a metal-semiconductor compound layer (e.g., a tungsten silicide layer, a cobalt silicide layer or the like).

A gate dielectric pattern 160 may be disposed between the substrate 100 and the gate pattern 170. The gate dielectric pattern 160 may include at least one of an oxide layer (e.g., a thermal oxide layer), a nitride layer, and a high-k dielectric layer (e.g., a metal oxide layer such as an aluminum oxide layer, a hafnium oxide layer or the like).

An interlayer dielectric layer 180 may be disposed on the substrate including the gate pattern 170. The interlayer dielectric layer 180 may cover the gate pattern 170 and the substrate 100. According to an embodiment, the interlayer dielectric layer 180 may include an oxide layer, a nitride layer or an oxynitride layer. According to an embodiment, the interlayer dielectric layer 180 may have a single-layered structure or a multi-layered structure.

First, second, third and fourth contact plugs 185a, 185b, 185c and 185d may be disposed in the interlayer dielectric layer 180. The first, second, third and fourth contact plugs 185a, 185b, 185c and 185d may be spaced apart from each other. The first contact plug 185a may be electrically connected to the first doping region 150a, and the second contact plug 185b may be electrically connected to the second doping region 150b. The third contact plug 185c may be electrically connected to the third doping region 150c, and the fourth contact plug 185d may be electrically connected to the gate pattern 170.

Each of the first, second, third and fourth contact plugs 185a, 185b, 185c and 185d may include a conductive material. For example, each of the first, second, third and fourth contact plugs 185a, 185b, 185c and 185d may include at least one of a doped semiconductor layer (e.g., a doped silicon layer, a doped germanium layer or the like), a metal layer (e.g., a tungsten layer, a titanium layer, a tantalum layer or the like), a conductive metal nitride layer (e.g., a titanium nitride layer, a tantalum nitride layer or the like), and a metal-semiconductor compound layer (e.g., a tungsten silicide layer, a cobalt silicide layer or the like). According to an embodiment, the first, second, third and fourth contact plugs 185a, 185b, 185c and 185d may include the same conductive material.

First, second and third interconnection lines 193, 195 and 197 may be disposed on the interlayer dielectric layer 180. The first interconnection line 193 may be electrically connected to the first and second contact plugs 185a and 185b. The second interconnection line 195 may be electrically connected to the fourth contact plug 185d, and the third interconnection line 197 may be electrically connected to the third contact plug 185c.

Each of the first, second and third interconnection lines 193, 195 and 197 may include a conductive material. For example, according to an embodiment, each of the first, second and third interconnection lines 193, 195 and 197 may include at least one of a doped semiconductor layer (e.g., a doped silicon layer, a doped germanium layer or the like), a metal layer (e.g., a tungsten layer, a titanium layer, a tantalum layer or the like), a conductive metal nitride layer (e.g., a titanium nitride layer, a tantalum nitride layer or the like), and a metal-semiconductor compound layer (e.g., a tungsten silicide layer, a cobalt silicide layer or the like).

According to an embodiment, the first depth D1 of the isolation pattern 140a may be less than the second depth D2 of the two dielectric patterns 140c. The isolation pattern 140a may have a function enduring a high voltage between the third doping region 150c and the gate pattern 170. When a power MOS transistor according to an embodiment operates, an inversion channel may be formed in a portion of the first well region 109a overlapping the gate pattern 170. When the inversion channel is formed, carriers (e.g., electrons or holes) may be drifted along the drift region 107 and the inversion channel disposed between the third doping region 150c and the second doping region 150b. The carriers may move through the drift region 107 between the first well region 109a and the isolation pattern 140a. When the first depth D1 of the isolation pattern 140a is equal to or greater than the second depth D2 of the two dielectric patterns 140c, a drift length of the carriers between the first well region 109a and the second well region 109b may increase. Thus, an on-resistance of the power MOS transistor may also be increased. However, according to an embodiment, the first depth D1 of the isolation pattern 140a may be less than the second depth D2 of the two dielectric patterns 140c as described above. Hence, the drift length of the carriers between the first well region 109a and the second well region 109b may be reduced to minimize the on-resistance of the power MOS transistor.

The drift region 107 may include the body and the protrusion 107p downwardly protruding from the body. A depth of the drift region 107 under the isolation pattern 140a may increase because of the presence of the protrusion 107p. Thus, a cross sectional area of the drift region 107, through which the carriers are drifted, may increase to reduce the on-resistance of the power MOS transistor.

Figure 2:
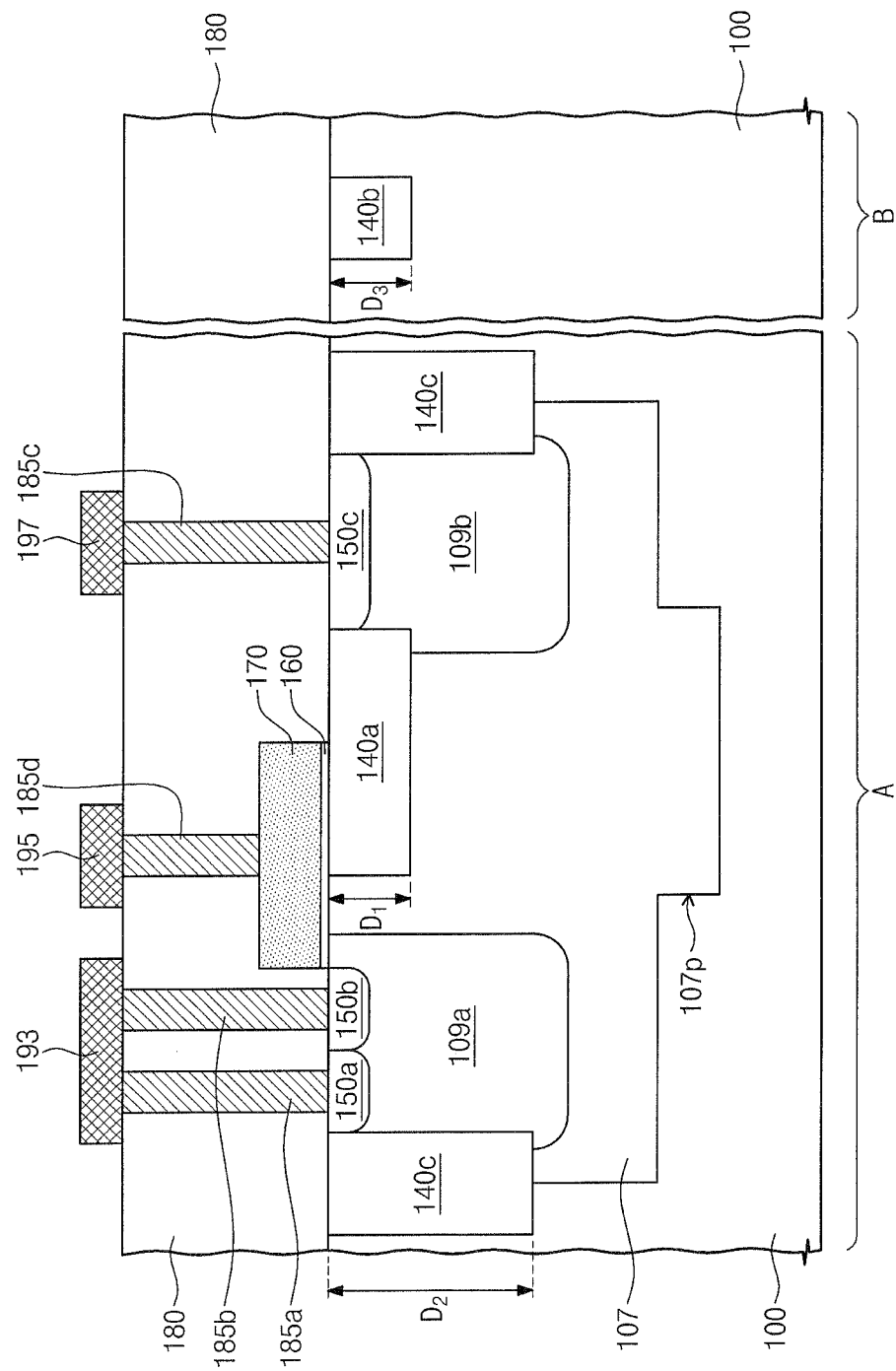
FIG. 2 is a cross sectional view illustrating a semiconductor device according to an embodiment.

FIG. 2 is a cross sectional view illustrating a semiconductor device according to an embodiment.

Referring to FIG. 2, a substrate 100 includes a transistor region A and an alignment region B. The transistor region A may include all the elements described in connection with FIG. 1.

A buried dielectric pattern 140b may be disposed in the substrate 100 of the alignment region B. According to an embodiment, the buried dielectric pattern 140b may include a nitride material, an oxide material or an oxynitride material. According to an embodiment, the buried dielectric pattern 140b may include the same dielectric material as the isolation pattern 140a and the dielectric patterns 140c. For example, according to an embodiment, all of the buried dielectric pattern 140b, the isolation pattern 140a and the dielectric patterns 140c may include a silicon oxide material.

The buried dielectric pattern 140b may have a third depth D3. In an embodiment, the third depth D3 of the buried dielectric pattern 140b may be equal or substantially equal to the first depth D1 of the isolation pattern 140a. According to an embodiment, the third depth D3 of the buried dielectric pattern 140b may be less than the second depth of the dielectric patterns 140c.

The semiconductor device of FIG. 2 may exhibit the same or substantially the same effect as the semiconductor device described with reference to FIG. 1.

A method of forming a semiconductor device according to an embodiment is described in detail hereinafter with reference to FIGS. 2 to 8. FIGS. 3 to 8 are cross sectional views illustrating a method of forming a semiconductor device according to an embodiment.

Figure 3:
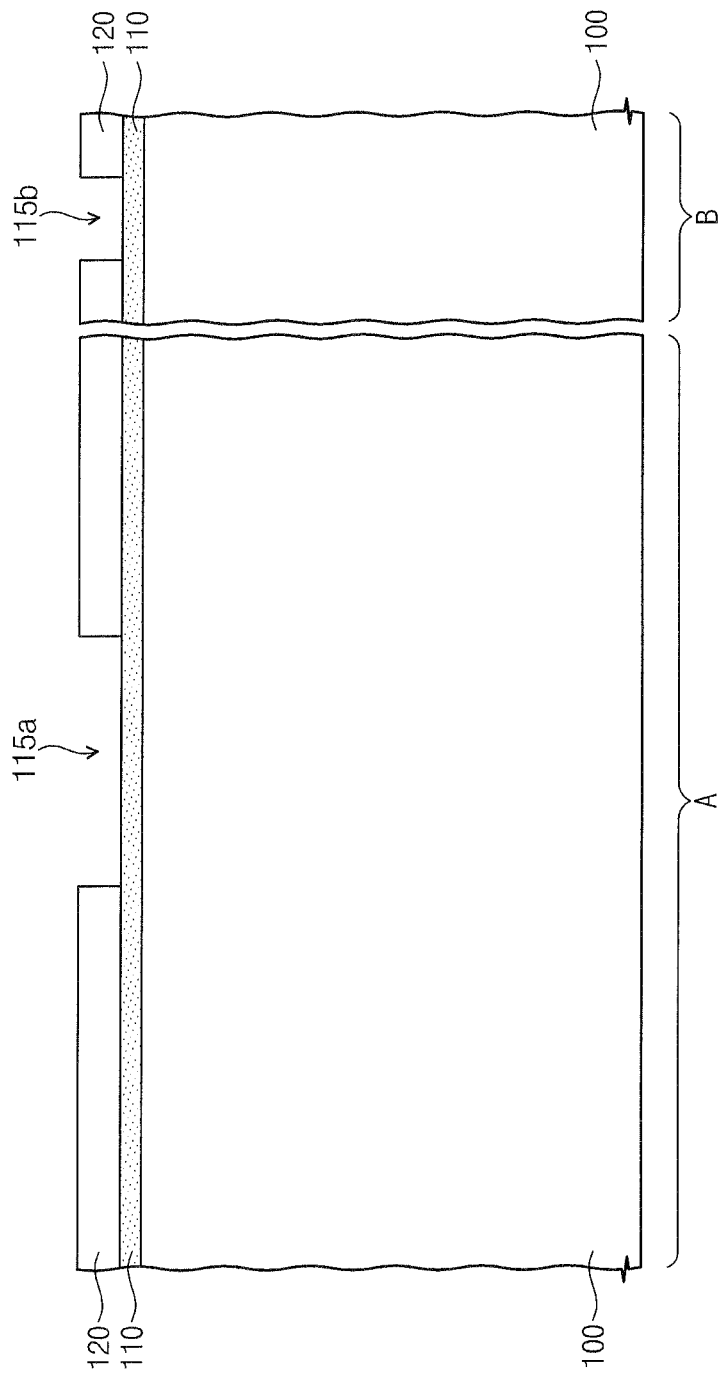
FIGS. 3 to 8 are cross sectional views illustrating a method of forming a semiconductor device according to an embodiment.

Referring to FIG. 3, a substrate 100 having a transistor region A and an alignment region B may be provided. The alignment region B may be provided to form alignment keys used in exposure processes, and the transistor region A may be provided to form transistors constituting a semiconductor device. According to an embodiment, the substrate 100 may be a silicon substrate, a germanium substrate or a compound semiconductor substrate. Alternatively, the substrate 100 may include an epitaxial semiconductor layer.

An anti-reflection layer 110 may be formed on the substrate 100. In an embodiment, the anti-reflection layer 110 may be formed of a material having etch selectivity with respect to the substrate 100. For example, according to an embodiment, when the substrate 100 is a silicon substrate, the anti-reflection layer 110 may be formed of a silicon nitride layer.

A first mask pattern 120 may be formed on the anti-reflection layer 110. The first mask pattern 120 may be formed to include a first opening 115a and a second opening 115b. The first opening 115a may be formed in the transistor region A, and the second opening 115b may be formed in the alignment region B. Each of the first opening 115a and the second opening 115b may expose a portion of the anti-reflection layer 110.

Figure 4:
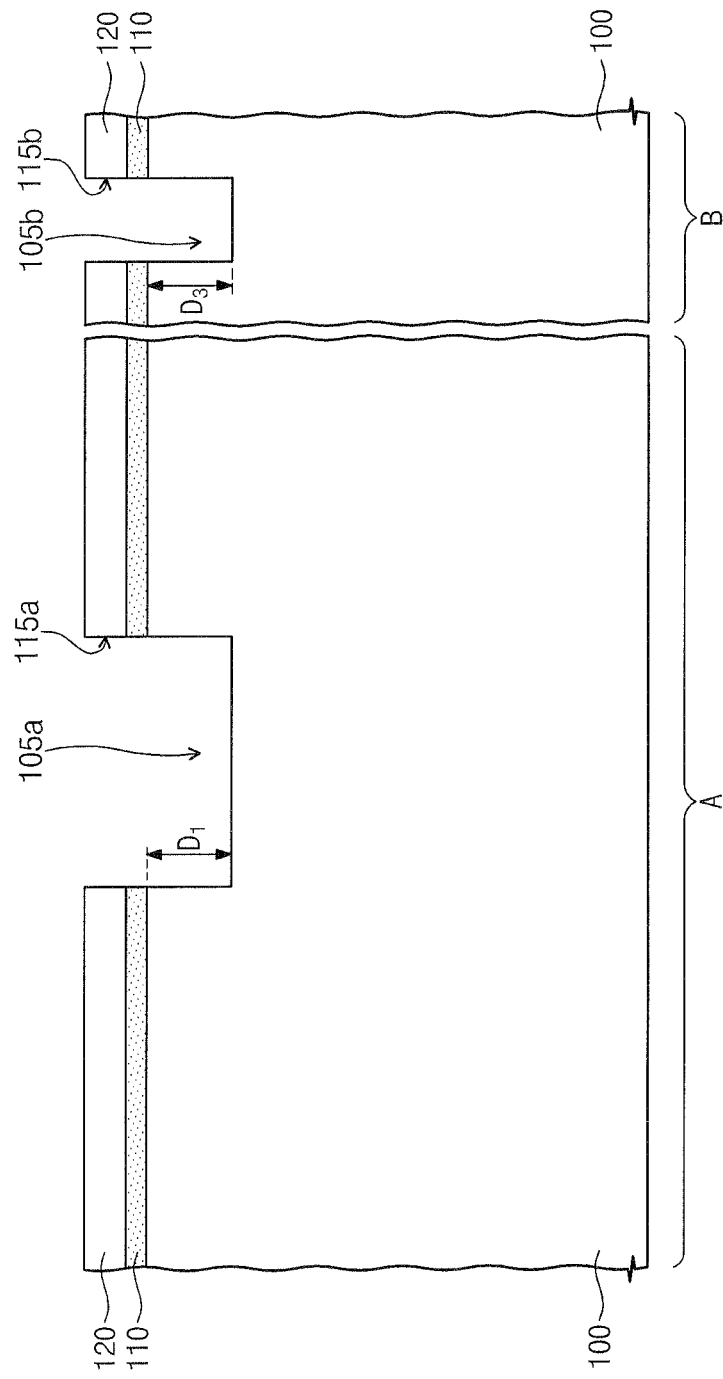

Referring to FIG. 4, a first trench 105a and a second trench 105b may be formed in the substrate 100. The first trench 105a may be formed in the substrate 100 of the transistor region A, and the second trench 105b may be formed in the substrate 100 of the alignment region B. The second trench 105b may be used as an alignment key in subsequent exposure processes.

The first trench 105a and the second trench 105b may be formed by sequentially etching the anti-reflection layer 110 and the substrate 100 using the first mask pattern 120 as an etch mask. According to an embodiment, the anti-reflection layer 110 and the substrate 100 may be etched using at least a dry etching process. According to an embodiment, etching the anti-reflection layer 110 and etching the substrate 100 may be performed in a single process chamber. Alternatively, the anti-reflection layer 110 and the substrate 100 may be etched using two different dry etching processes. According to an embodiment, the anti-reflection layer 110 may be etched in a first process chamber, and the substrate 100 may be etched in a second process chamber different from the first process chamber.

The first trench 105a may be formed to have a first depth D1, and the second trench 105b may be formed to have a third depth D3. According to an embodiment, the first depth D1 may be equal or substantially equal to the third depth D3.

According to an embodiment, the first trench 105a may be formed to have a uniform depth throughout an entire region thereof. For example, an entire bottom surface of the first trench 105a may be flat without any uneven profile or any step differences.

Figure 5:
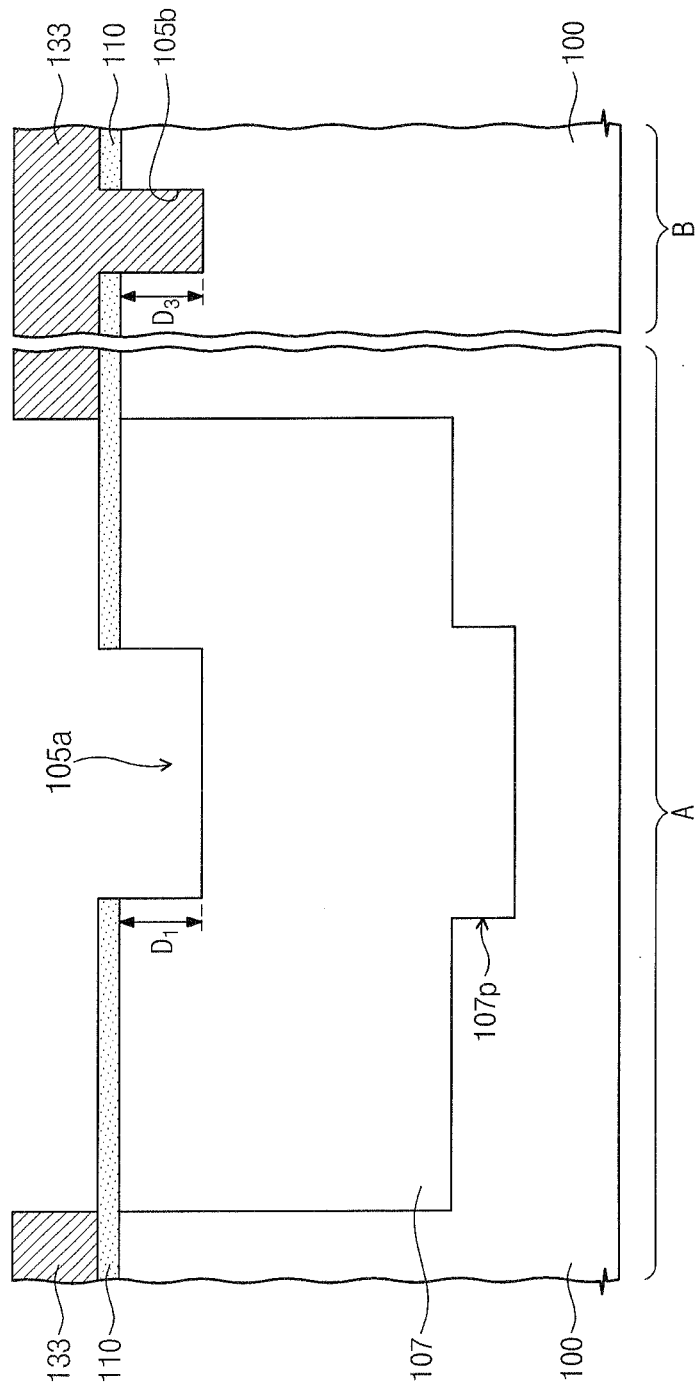

Referring to FIG. 5, the first mask pattern 120 may be removed. The first mask pattern 120 may be removed using an etching process that exhibits an etch selectivity with respect to the anti-reflection layer 110 and the substrate 100. In an embodiment, the first mask pattern 120 may be removed using a wet etching process.

A second mask pattern 133 may be formed on the substrate where the first mask pattern 120 is removed. The second mask pattern 133 may be formed to fill the second trench 105b. The second mask pattern 133 may be formed to completely cover the alignment region B and to expose a portion (e.g., the first trench 105a) of the transistor region A. In an embodiment, the second mask pattern 133 may be formed of a photoresist layer.

A drift region 107 may be formed in the substrate 100 under a region exposed by the second mask pattern 133. The drift region 107 may be formed by implanting dopants of a first conductivity type into the substrate 100 using the second mask pattern 133 as an implantation mask.

The drift region 107 may be formed to have a protrusion 107p that protrudes toward a bottom surface of the substrate 100. This protrusion 107p may be formed due to the presence of the first trench 105a. The protrusion 107p may be formed to have a similar profile to the first trench 105a. The protrusion 107p may be formed since the drift region 107 is formed after formation of the first trench 105a.

Figure 6:
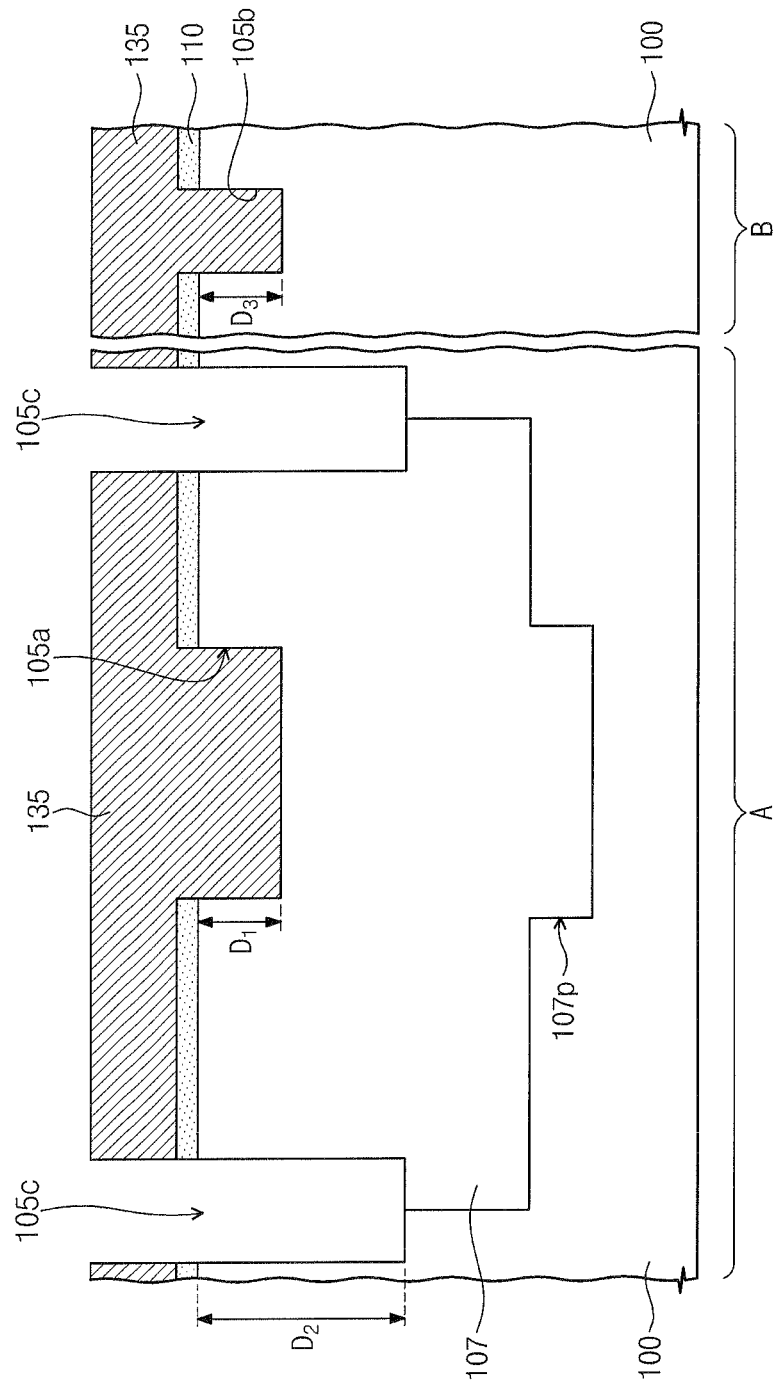

Referring to FIG. 6, the second mask pattern 133 may be removed. The second mask pattern 133 may be removed using an etching process that exhibits an etch selectivity with respect to the anti-reflection layer 110 and the substrate 100.

In an embodiment, the second mask pattern 133 may be removed using a wet etching process.

A third mask pattern 135 may be formed on the substrate where the second mask pattern 133 is removed. The third mask pattern 135 may be formed to fill the second trench 105b. The third mask pattern 135 may be formed to completely cover the alignment region B and to expose some portions of the transistor region A. In an embodiment, the third mask pattern 135 may be formed of a photoresist layer.

Two third trenches 105c may be formed in the substrate 100. The two third trenches 105c may be formed by etching the substrate using the third mask pattern 135 as an etch mask. The two third trenches 105c may be formed to be spaced apart from each other. One of the two third trenches 105c may be formed to be adjacent to a first end of the drift region 107, and the other of the two third trenches 105c may be formed to be adjacent to a second end of the drift region 107, which is located opposite to the first end. Accordingly, the drift region 107 may be disposed between the two third trenches 105c.

The two third trenches 105c may be formed to have a second depth D2. The second depth D2 may be greater than the first depth D1. For example, according to an embodiment, the second depth D2 may be greater than about twice the first depth D1.

Figure 7:
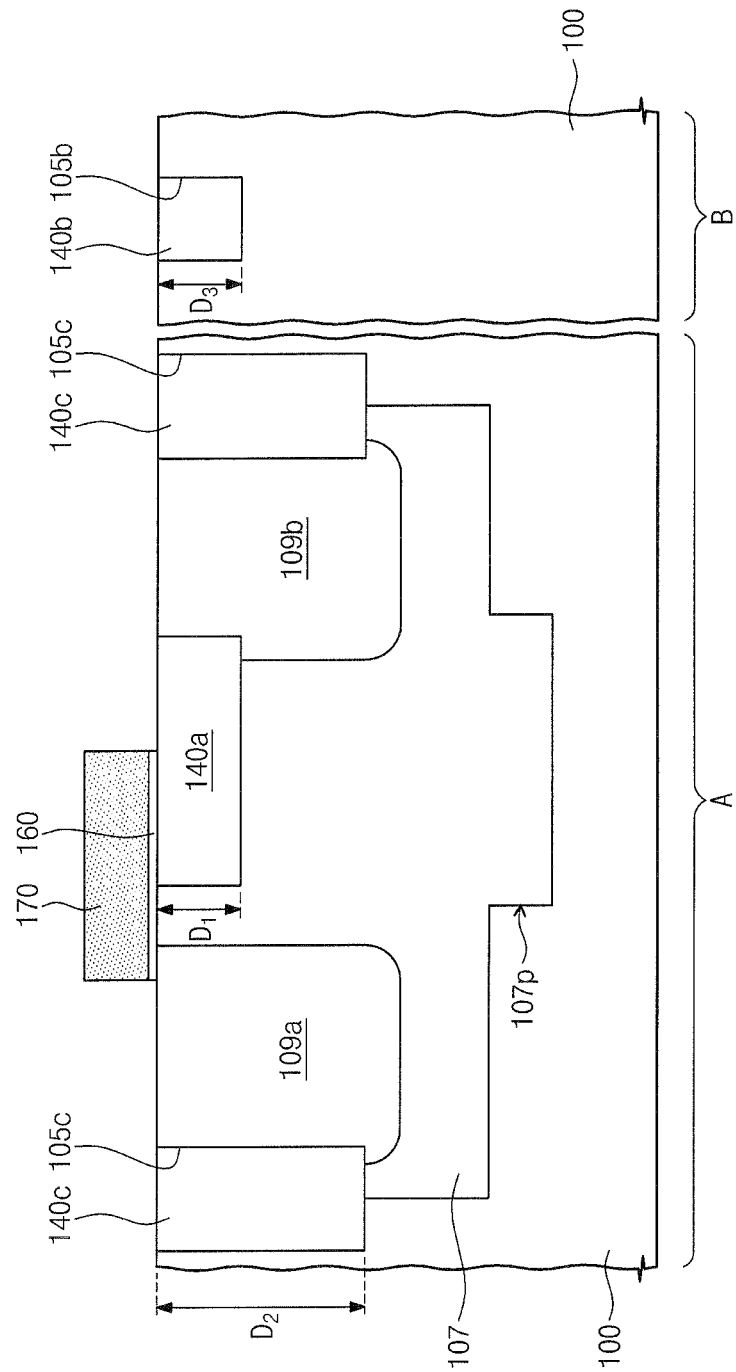

Referring to FIG. 7, the third mask pattern 135 may be removed. An isolation pattern 140a, two dielectric patterns 140c and a buried dielectric pattern 140b may be then formed in the substrate 100. The isolation pattern 140a may be formed in the first trench 105a, the two dielectric patterns 140c may be respectively formed in the two third trenches 105c, and the buried dielectric pattern 140b may be formed in the second trench 105b.

According to an embodiment, the isolation pattern 140a, the two dielectric patterns 140c and the buried dielectric pattern 140b may be formed by depositing a dielectric layer on the substrate where the third mask pattern 135 is removed and by planarizing the dielectric layer until a top surface of the substrate 100 is exposed.

The dielectric patterns 140c and the isolation pattern 140a may define active regions.

A first well region 109a and a second well region 109b may be formed in the substrate 100. The first well region 109a may be formed in the drift region 107 between one of the two dielectric patterns 140c and the isolation pattern 140a. The first well region 109a may be formed by implanting dopants of a second conductivity type into the drift region 107 between one of the two dielectric patterns 140c and the isolation pattern 140a. According to an embodiment, the second conductivity type may be a different conductivity type from the first conductivity type. According to an embodiment, when the first conductivity type is an N-type, the second conductivity type may be a P-type.

A first end of the first well region 109a may contact one of the two dielectric patterns 140c. A second end of the first well region 109a, which is positioned opposite to the first end, may be spaced apart from the isolation pattern 140a. For example, a portion of the drift region 107 may be provided between the first well region 109a and the isolation pattern 140a.

The second well region 109b may be formed in the drift region 107 between the other of the two dielectric patterns 140c and the isolation pattern 140a. The second well region 109b may be formed by implanting dopants of the first conductivity type into the drift region 107 between the other of the two dielectric patterns 140c and the isolation pattern 140a. According to an embodiment, a first end of the second well region 109b may contact the isolation pattern 140a, and a second end of the second well region 109b, which is positioned opposite to the first end, may contact the other of the two dielectric patterns 140c.

Figure 8:
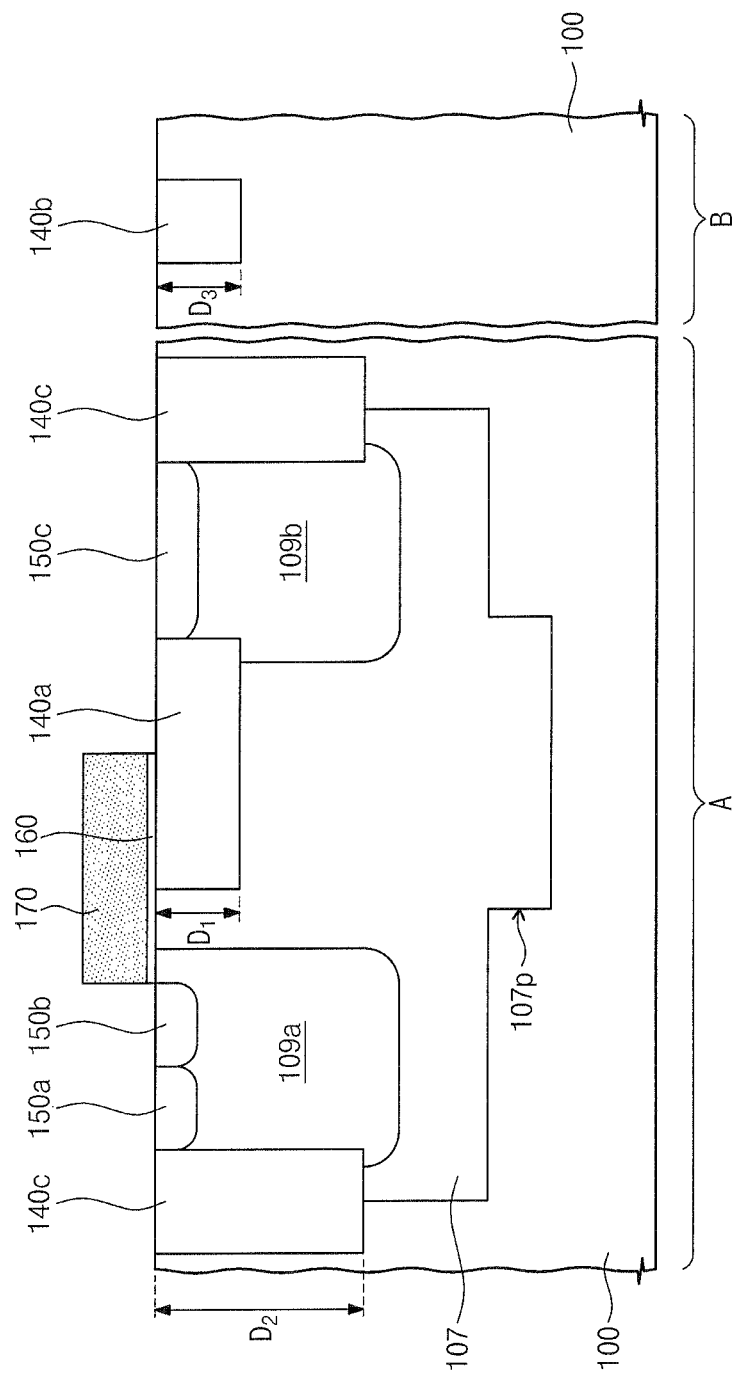

Referring to FIG. 8, a first doping region 150a and a second doping region 150b may be formed in the first well region 109a. The first doping region 150a may be formed by implanting dopants of the second conductivity type into a portion of the first well region 109a, and the second doping region 150b may be formed by implanting dopants of the first conductivity type into the first well region 109a adjacent to the first doping region 150a.

The first doping region 150a and the second doping region 150b may be formed to be laterally adjacent to each other in a surface region of the first well region 109a. According to an embodiment, the first doping region 150a and the second doping region 150b may be formed to be sequentially arranged along a direction from the dielectric pattern 140c adjacent to the first well region 109a toward the isolation pattern 140a. In an embodiment, the first and second doping regions 150a and 150b may be formed to contact each other.

A third doping region 150c may be formed in the second well region 109b. The third doping region 150c may be formed by implanting dopants of the first conductivity type into a surface region of the second well region 109b.

A gate dielectric pattern 160 and a gate pattern 170 may be formed on the substrate 100. According to an embodiment, the gate dielectric pattern 160 and the gate pattern 170 may be formed by sequentially forming a gate dielectric layer and a gate conductive layer on the substrate 100 and by patterning the gate conductive layer and the gate dielectric layer.

Referring again to FIG. 2, an interlayer dielectric layer 180 may be formed on the substrate including the gate dielectric pattern 160 and the gate pattern 170. According to an embodiment, the interlayer dielectric layer 180 may be formed using a chemical vapor deposition (CVD) process.

First, second, third and fourth holes may be formed to penetrate the interlayer dielectric layer 180. The first hole may be formed to expose a portion of the first doping region 150a, and the second hole may be formed to expose a portion of the second doping region 150b. The third hole may be formed to expose a portion of the third doping region 150c, and the fourth hole may be formed to expose a portion of the gate pattern 170.

First, second, third and fourth contact plugs 185a, 185b, 185c and 185d may be formed in the first, second, third and fourth holes, respectively. The first, second, third and fourth contact plugs 185a, 185b, 185c and 185d may be formed by depositing a conductive layer on the substrate including the first, second, third and fourth holes and by planarizing the conductive layer until a top surface of the interlayer dielectric layer 180 is exposed.

First, second and third interconnection lines 193, 195 and 197 may be formed on the interlayer dielectric layer 180. The first interconnection line 193 may be electrically connected to the first and second contact plugs 185a and 185b. The second interconnection line 195 may be electrically connected to the fourth contact plug 185d. The third interconnection line 197 may be electrically connected to the third contact plug 185c. The first, second and third interconnection lines 193, 195 and 197 may be formed by depositing a conductive layer on the substrate including the first to fourth contact plugs 185a, 185b, 185c and 185d and by patterning the conductive layer.

According to the above embodiments, a first trench may be formed in a substrate of a transistor region, and a second trench used as an alignment key in exposure processes is formed in the substrate of an alignment region. Without an additional patterning process, the first trench shallower than a third trench may be formed since the first and second trenches are simultaneously formed using a single patterning process. Thus, a fabrication process of a semiconductor device may be simplified to reduce fabrication costs of the semiconductor device.

A depth of the first trench, at which an isolation pattern is formed, may be less than a depth of third trenches at which dielectric patterns 140c are formed. Hence, a drift length of carriers moving along a drift region may be reduced to minimize the on-resistance of a power MOS transistor.

While the embodiments of the inventive concept have been described, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A semiconductor device comprising:
   two dielectric patterns in a substrate;
   a drift region disposed in the substrate between the two dielectric patterns to have a protrusion protruding toward a bottom surface of the substrate;
   an isolation pattern in the drift region between the two dielectric patterns;
   a gate pattern on the substrate; and
   a source region and a drain region at both sides of the gate pattern,
   wherein a depth of the two dielectric patterns is greater than a depth of the isolation pattern.

2. The semiconductor device of claim 1, wherein an entire bottom surface of the isolation pattern has a uniform depth.

3. The semiconductor device of claim 1, wherein the protrusion of the drift region overlaps the isolation pattern.

4. The semiconductor device of claim 1, wherein the substrate has a transistor region and an alignment region, wherein the semiconductor device further comprises a buried dielectric pattern in the substrate of the alignment region, and
   wherein a depth of the buried dielectric pattern is equal or substantially equal to the depth of the isolation pattern.

5. The semiconductor device of claim 1, further comprising a first well region and a second well region disposed in the drift region to be spaced apart from each other,
   wherein the first well region is disposed between one of the two dielectric patterns and the isolation pattern,
   wherein the second well region is disposed between the other of the dielectric patterns and the isolation pattern, and
   wherein the first well region is spaced apart from the isolation pattern.

6. The semiconductor device of claim 5, further comprising:
   a first doping region and a second doping region in the first well region; and
   a third doping region in the second well region,
   wherein the gate pattern covers the first well region and the drift region disposed between the second doping region and the isolation pattern.

7. The semiconductor device of claim 6, wherein when voltage biases are applied to the gate pattern, the first doping region, the second doping region and the third doping region, carriers are drifted along the drift region between the first and second well regions.

8. A semiconductor device comprising:
   a substrate;
   a drift region in the substrate, wherein the drift region includes a protrusion;
   a first doping pattern;
   a second doping pattern;
   an isolation pattern between the first and second doping patterns, wherein the isolation pattern is spaced apart from the first doping pattern and contacts the second doping pattern; and
   a gate pattern on the substrate, wherein the gate pattern overlaps at least a portion of the isolation pattern, wherein the protrusion of the drift region overlaps at least a portion of the isolation pattern.

9. The semiconductor device of claim 8, further comprising a dielectric pattern adjacent to at least one of the first doping pattern or the second doping pattern, wherein a depth of the dielectric pattern is larger than a depth of the isolation pattern.

10. The semiconductor device of claim 8, wherein a width of the protrusion of the drift region is the same or substantially the same as a width of the isolation pattern.

11. The semiconductor device of claim 8, wherein a width of the protrusion of the drift region is larger than a width of the isolation pattern.

12. The semiconductor device of claim 8, further comprising a well region in the substrate, wherein the well region covers the first doping pattern, and wherein at least a portion of the well region overlaps the gate pattern.

* * * * *